(12) United States Patent
Chen et al.

(10) Patent No.: US 12,022,724 B2
(45) Date of Patent: *Jun. 25, 2024

(54) FLEXIBLE PANEL AND METHOD OF FABRICATING THE SAME

(71) Applicant: HannStar Display Corporation, Taipei (TW)

(72) Inventors: Yen-Chung Chen, Taichung (TW); Mei-Ling Chou, Tainan (TW); Chia-Yu Liu, Tainan (TW)

(73) Assignee: HannStar Display Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/315,507

(22) Filed: May 11, 2023

(65) Prior Publication Data

US 2023/0284514 A1 Sep. 7, 2023

Related U.S. Application Data

(63) Continuation of application No. 17/111,526, filed on Dec. 4, 2020, now Pat. No. 11,700,764.

(30) Foreign Application Priority Data

Jun. 29, 2020 (CN) .......................... 202010601029.0

(51) Int. Cl.
*G06F 3/041* (2006.01)
*G02F 1/1333* (2006.01)
*H10K 71/00* (2023.01)
*H10K 77/10* (2023.01)

(52) U.S. Cl.
CPC ...... *H10K 77/111* (2023.02); *G02F 1/133305* (2013.01); *G06F 3/0412* (2013.01); *H10K 71/00* (2023.02); *G06F 2203/04102* (2013.01); *G06F 2203/04103* (2013.01)

(58) Field of Classification Search
None
See application file for complete search history.

(56) References Cited

U.S. PATENT DOCUMENTS

| 9,425,418 | B2 | 8/2016 | Kwon et al. |
| 11,700,764 | B2 * | 7/2023 | Chen ..................... G06F 3/0412 257/79 |
| 2013/0273315 | A1 | 10/2013 | Mansky et al. |
| 2017/0207278 | A1 | 7/2017 | Lu et al. |
| 2020/0203463 | A1 | 6/2020 | Seol et al. |

(Continued)

FOREIGN PATENT DOCUMENTS

| CN | 104022125 A | 9/2014 |
| CN | 104512075 A | 4/2015 |
| CN | 104576970 A | 4/2015 |

(Continued)

*Primary Examiner* — Brian M Butcher
(74) *Attorney, Agent, or Firm* — CKC & Partners Co., LLC

(57) ABSTRACT

A flexible touch panel includes a flexible touch substrate, an overcoat layer, a device layer, and a waterproof layer. The overcoat layer is disposed over and directly contacting the flexible touch substrate. An adhesive force of the overcoat layer obtained according to an ASTM D3359 cross-cut test is greater than 4B. The device layer is disposed over the overcoat layer. The waterproof layer is interposed between the overcoat layer and the device layer.

20 Claims, 4 Drawing Sheets

(56) References Cited

U.S. PATENT DOCUMENTS

| | | | |
|---|---|---|---|
| 2020/0227586 | A1 | 7/2020 | Wang et al. |
| 2022/0113464 | A1 | 4/2022 | Spring et al. |

FOREIGN PATENT DOCUMENTS

| | | | |
|---|---|---|---|
| CN | 108962962 | A | 12/2018 |
| CN | 109638178 | A | 4/2019 |
| CN | 109742265 | A | 5/2019 |
| CN | 109801945 | A | 5/2019 |
| KR | 20080002314 | A | 1/2008 |
| WO | 2019024141 | A1 | 2/2019 |

\* cited by examiner

FLEXIBLE PANEL AND METHOD OF FABRICATING THE SAME

RELATED APPLICATIONS

This application is a continuation application of U.S. application Ser. No. 17/111,526, filed Dec. 4, 2020, which claims priority to Chinese Application Serial Number 202010601029.0 filed Jun. 29, 2020, all of which are herein incorporated by reference.

BACKGROUND

Field of Invention

The invention is related to a flexible panel and a method of fabricating the flexible panel.

Description of Related Art

With the progress of panel production technology, bendable flexible panels, including flexible display panels, flexible touch panels, flexible touch display panels, and so on, can be fabricated. However, for the production of conventional flexible panels, an additional layer, such as a sacrificial layer, a release layer, or a release layer with an adhesive layer, is usually formed between a carrier and a flexible substrate, so as to separate the flexible substrate from the carrier in a subsequent process, thus leading to an increase of production cost. On the other hand, if the adhesive layer contains volatile materials, the quality of the flexible panel would be affected.

SUMMARY

One aspect of the invention is directed to a flexible touch panel which includes a flexible touch substrate, an overcoat layer, a device layer and a waterproof layer. The overcoat layer is disposed over and directly contacting the flexible touch substrate, in which an adhesive force of the overcoat layer obtained according to an ASTM D3359 cross-cut test is greater than 4B. The device layer is disposed over the overcoat layer. The waterproof layer interposed between the overcoat layer and the device layer.

In one embodiment of the invention, the overcoat layer includes an organic material layer.

In one embodiment of the invention, the overcoat layer includes acrylic, diethylene glycol methylethyl ether, methyl 3-methoxypropionate, poly-functional monomers or additives.

In one embodiment of the invention, the waterproof layer includes aluminum oxide, aluminum nitride, silicon oxide, or silicon nitride.

In one embodiment of the invention, the device layer includes a touch electrode layer.

In one embodiment of the invention, a thickness of the flexible touch substrate is in a range from 8 microns to 10 microns.

Another aspect of the invention is directed to a flexible touch panel which includes a flexible touch substrate, an overcoat layer, a device layer and an optical layer. The overcoat layer is disposed over and directly contacting the flexible touch substrate, in which an adhesive force of the overcoat layer obtained according to an ASTM D3359 cross-cut test is greater than 4B. The device layer is disposed over the overcoat layer. The optical layer is interposed between the overcoat layer and the device layer.

In one embodiment of the invention, the overcoat layer includes an organic material layer.

In one embodiment of the invention, the overcoat layer includes acrylic, diethylene glycol methylethyl ether, methyl 3-methoxypropionate, poly-functional monomers or additives.

In one embodiment of the invention, the optical layer includes niobium oxide, silicon oxide, titanium oxide, silicon nitride, or magnesium fluoride.

In one embodiment of the invention, the device layer comprises a touch electrode layer.

In one embodiment of the invention, a thickness of the flexible touch substrate is in a range from 8 microns to 10 microns.

Yet another aspect of the invention is directed to a flexible touch panel which includes a flexible touch substrate, an overcoat layer, a device layer, a waterproof layer and an optical layer. The overcoat layer is disposed over and directly contacting the flexible touch substrate, in which an adhesive force of the overcoat layer obtained according to an ASTM D3359 cross-cut test is greater than 4B. The device layer is disposed over the overcoat layer. The waterproof layer is disposed over and directly contacting the overcoat layer. The optical layer is interposed between the waterproof layer and the device layer.

In one embodiment of the invention, the overcoat layer includes an organic material layer.

In one embodiment of the invention, the overcoat layer includes acrylic, diethylene glycol methylethyl ether, methyl 3-methoxypropionate, poly-functional monomers or additives.

In one embodiment of the invention, the overcoat layer includes organic material layers and inorganic material layers that are alternately stacked.

In one embodiment of the invention, the optical layer includes niobium oxide, silicon oxide, titanium oxide, silicon nitride, or magnesium fluoride.

In one embodiment of the invention, the waterproof layer includes aluminum oxide, aluminum nitride, silicon oxide, or silicon nitride.

In one embodiment of the invention, the device layer comprises a touch electrode layer.

In one embodiment of the invention, a thickness of the flexible touch substrate is in a range from 8 microns to 10 microns.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation.

It will be understood that, although the terms "first," "second," and "third" may be used herein to describe various elements, components, areas and/or portions, these elements, components, areas and/or portions, should not be limited by these terms. These terms are only used to distinguish elements, components, areas and/or portions.

Terms used herein are only used to describe the specific embodiments, which are not used to limit the claims appended herewith. Unless limited otherwise, the term "a," "an," "one" or "the" of the single form may also represent the plural form. In addition, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Regarding the term "coupled" used in the following description, it may be used to indicate that two or more elements are in direct physical or electrical contact with each other, or may also mean that two or more elements may not be in direct contact with each other. "Coupled" may still be used to indicate that two or more elements cooperate or interact with each other.

In the disclosure, a touch electrode layer may be used for touch detection, and it may be a single-layer electrode structure, such as a single indium tin oxide (SITO) structure, a single-layer multiple-touch structure, or a double-layer electrode structure, such as a double indium tin oxide (DITO) structure. The material of the touch electrode layer is not limited to indium tin oxide (ITO), which may also be metal such as gold and silver, or may be, for example, indium zinc oxide (IZO), indium oxide, tin oxide or another suitable conductive material. A liquid crystal display panel may be of various types, such as twisted nematic (TN), electrically controlled birefringence (ECB), in-plane switching (IPS), fringe-field switching (FFS), vertical alignment (VA) or non-aligned polymer-dispersed liquid crystal (PDLC), or may be an organic light-emitting diode (OLED) display panel, a mini-LED display panel or a micro-LED display panel.

Figure 1A:
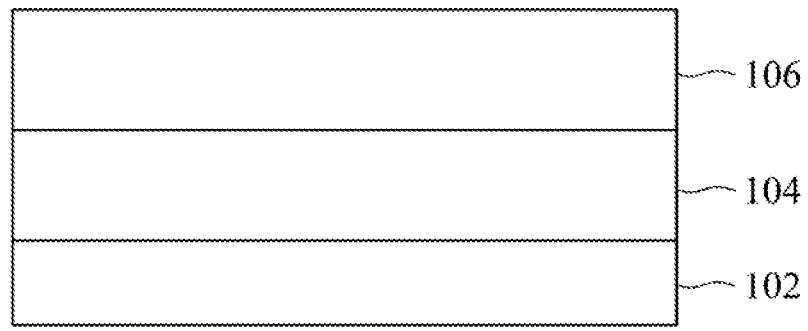
FIGS. 1A-1D are structural diagrams of respective flexible panels in accordance with various embodiments of the invention.

FIG. 1A is a structural diagram of a flexible panel 100A in accordance with some embodiments of the invention. As shown in FIG. 1A, the flexible panel 100A includes a flexible substrate 102, an overcoat layer 104 and a device layer 106. The flexible substrate 102 is bendable, and the thickness thereof may be less than 20 microns, e.g. 8 microns to 10 microns. In addition, the flexible substrate 102 may be formed of a transparent material. In some embodiments, the material of the flexible substrate 102 may include polyimide (PI) and/or another suitable material. The overcoat layer 104 is disposed over the flexible substrate 102, and the material of the overcoat layer 104 may include acrylic, diethylene glycol methylethyl ether, methyl 3-methoxypropionate, poly-functional monomers (e.g. ethylene glycol dimethacrylate and/or the material of CAS No. 478556-66-0), additives (e.g. the material of CAS No. 14513-34-9). The thickness of the overcoat layer 104 may be less than 2 microns, e.g. about 0.8 microns to 1.2 microns. The device layer 106 is disposed over the overcoat layer 104. According to the type of the flexible panel 100A, the device layer 106 may be a touch electrode layer, a liquid crystal display (LCD) structure, an organic light emitting diode (OLED) display structure or a micro light emitting diode (micro LED) display structure, but is not limited thereto. For example, if the flexible panel 100A is used for touch detection, the device layer 106 may be a touch electrode layer; and if the flexible panel 100A is used for image display, the device layer 106 may be an LCD structure or an OLED display structure. Furthermore, in some embodiments, if the flexible panel 100A is a touch panel, then the flexible panel 100A may be bonded to an additional display panel to form a touch display panel.

Figure 1B:
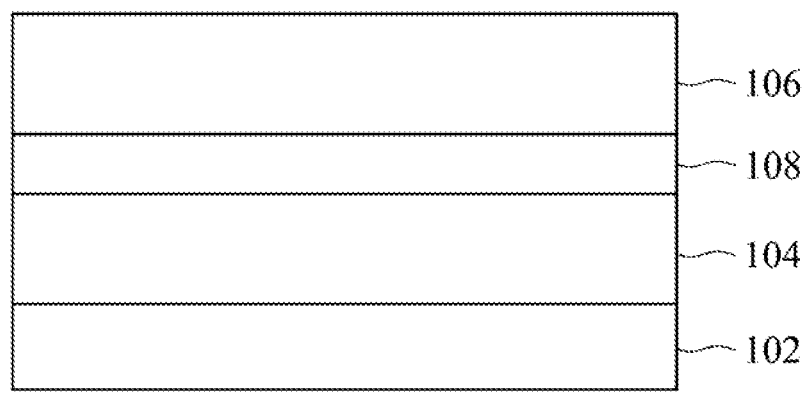

FIG. 1B is a structural diagram of a flexible panel 100B in accordance with some other embodiments of the invention. In comparison with the flexible panel 100A shown in FIG. 1A, as shown in FIG. 1B, the flexible panel 100B further includes a waterproof layer 108 disposed between the overcoat layer 104 and the device layer 106, so as to further block external moisture from entering into the device layer 106 and corroding the electronic components of the device layer 106. The waterproof layer 108 may include aluminum oxide, aluminum nitride, silicon oxide, silicon nitride, combinations thereof and/or another suitable waterproof material. In addition, the waterproof layer 108 may be formed of a single-layer structure or a multi-layer structure.

Figure 1C:
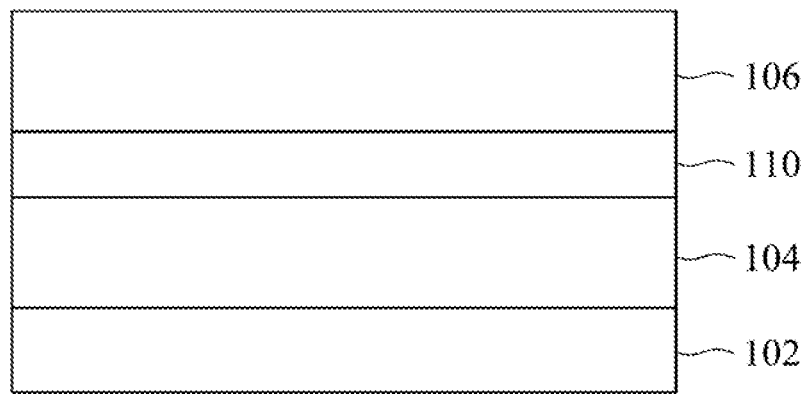

FIG. 1C is a structural diagram of a flexible panel 100C in accordance with some other embodiments of the invention. In comparison with the flexible panel 100A shown in FIG. 1A, as shown in FIG. 1C, the flexible panel 100C further includes an optical layer 110 disposed between the overcoat layer 104 and the device layer 106, so as to adjust the color presented by the flexible panel 100C. For example, if a particular material is selected to form the overcoat layer 104 so that the color presented by the whole flexible panel 100C turns yellowish, the optical layer 110 may reduce the degree of yellowish, in order to meet the taste requirements of some customers or users. The optical layer 110 may include niobium oxide (e.g. Nb2O5), silicon oxide, titanium oxide, silicon nitride, magnesium fluoride, combinations thereof and/or another suitable material. In addition, the optical layer 110 may be formed of a single-layer structure or a multi-layer structure.

Figure 1D:
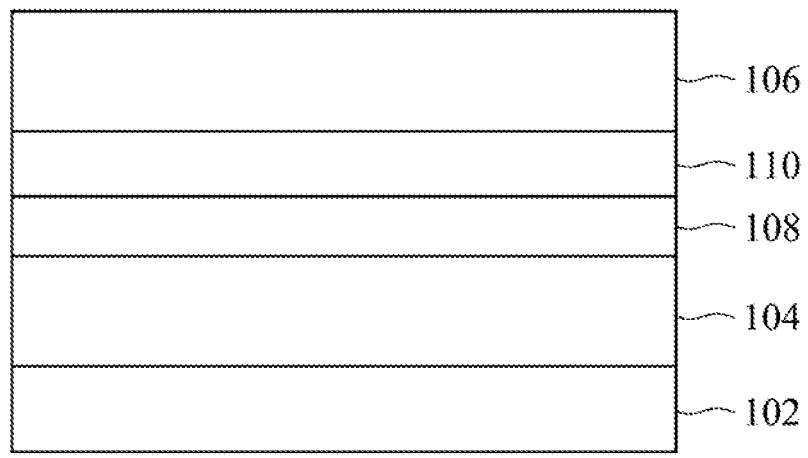

FIG. 1D is a structural diagram of a flexible panel 100D in accordance with some other embodiments of the invention. In comparison with the flexible panel 100A shown in FIG. 1A, as shown in FIG. 1D, the flexible panel 100D further includes a waterproof layer 108 and an optical layer 110, in which the waterproof layer 108 is disposed between the overcoat layer 104 and the optical layer 110, and the optical layer 110 is disposed between the waterproof layer 108 and the device layer 106, so as to adjust the color presented by the whole flexible panel 100A. The waterproof layer 108 and the optical layer 110 of the flexible panel 100D may be respectively the same as the waterproof layer 108 of the flexible panel 100B and the optical layer 110 of the flexible panel 100C. Further, the positions of the waterproof layer 108 and the optical layer 110 may be exchanged, i.e., the optical layer 110 may be disposed between the overcoat layer 104 and the waterproof layer 108, while the waterproof layer 108 may be disposed between the optical layer 110 and the device layer 106.

Figure 2A:
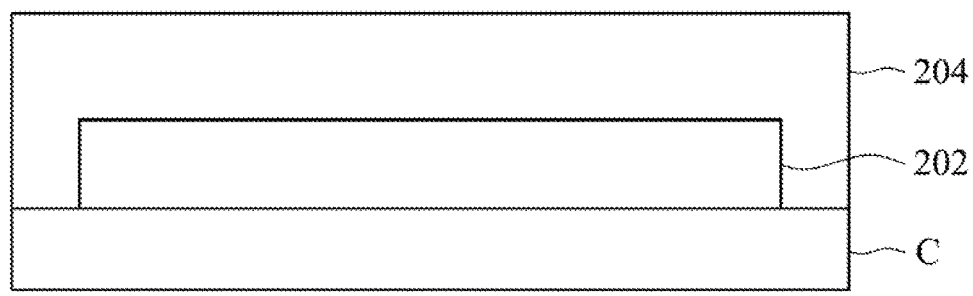
FIGS. 2A-2E are schematic cross sectional views of intermediate stages illustrating a method of fabricating a flexible panel in accordance with some embodiments of the invention.

FIGS. 2A-2E are schematic cross sectional views of intermediate stages illustrating a method of fabricating a flexible panel 200 in accordance with some embodiments of the invention. The method of fabricating the flexible panel 200 is described as follows. First, as shown in FIG. 2A, a carrier C is provided, a flexible substrate 202 and an overcoat layer 204 are sequentially formed over the carrier C. The carrier C may be a carrier glass or another suitable carrier substrate. The flexible substrate 202 directly contacts the carrier C, and the thickness of the flexible substrate 202 may be less than 20 microns, e.g. about 8 microns to 10 microns. In addition, the flexible substrate 202 may be formed of a transparent material, e.g. polyimide and/or another suitable material. The overcoat layer 204 is formed over the flexible substrate 202; the material of the overcoat layer 204 may include acrylic, diethylene glycol methylethyl ether, methyl 3-methoxypropionate, poly-functional monomers (e.g. ethylene glycol dimethacrylate and/or the material of CAS No. 478556-66-0), additives (e.g. the material of CAS No. 14513-34-9) and/or another suitable organic material, and the thickness of the overcoat layer 204 may be less than 2 microns, e.g. about 0.8 microns to 1.2 microns. According to the material of the flexible substrate 202, the flexible substrate 202 may be formed over the carrier C by coating or another suitable deposition process, or alternatively in a form of layered films, but is not limited thereto. In addition, the overcoat layer 204 may be formed over the carrier C and the flexible substrate 202 by coating or another suitable deposition process. In some embodiments, the overcoat layer 204 may be a structure formed of organic material layers and inorganic material layers that are alternately stacked.

Further, the overcoat layer 204 directly contacts the carrier C at the periphery of the flexible substrate 202. In addition, the peeling force between the overcoat layer 204 and the carrier C is greater than the peeling force between the flexible substrate 202 and the carrier C, and the peeling force between the flexible substrate 202 and the overcoat layer 204 is also greater than the peeling force between the flexible substrate 202 and the carrier C, so as to prevent the flexible substrate 202 from separating from the carrier C. Then, the flexible substrate 202 and the overcoat layer 204 are separated from the carrier C in a subsequent process. The peeling force between the flexible substrate 202 and the carrier C and the peeling force between the overcoat layer 204 and the carrier C may be correspondingly adjusted by respectively adjusting the materials of the flexible substrate 202 and the overcoat layer 204. In some embodiments, the peeling force between the flexible substrate 202 and the carrier C is less than or equal to 20 gf/cm, and/or the peeling force between the overcoat layer 204 and the carrier C is greater than or equal to 100 gf/cm. The overcoat layer 204 has an adhesive force that is greater than 4B after undergoing a cross-cut test according to the ASTM D3359 standard, thereby ensuring the adhesion.

Figure 2B:
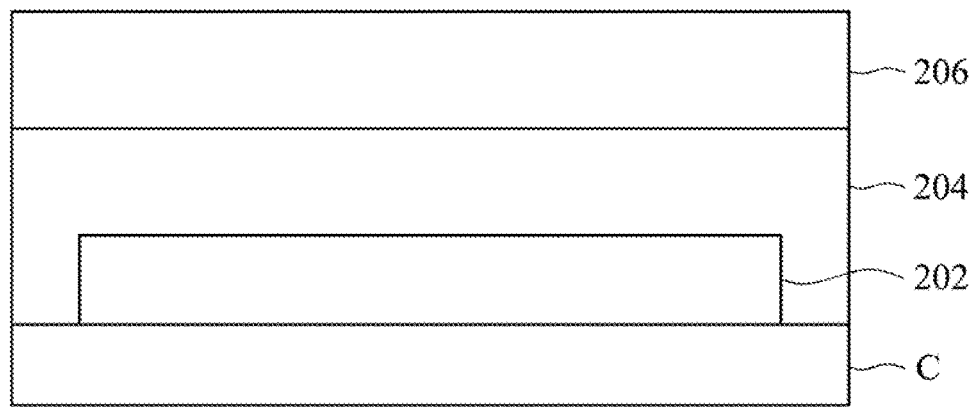

Then, as shown in FIG. 2B, a device layer 206 is formed over the overcoat layer 204. According to the type of the flexible panel 200, the device layer 206 may be a touch electrode layer, a liquid crystal display structure, an organic light emitting diode (OLED) display structure, a micro light emitting diode (micro LED) display structure or another suitable layer or structure. If the device layer 206 is a touch electrode layer, then a sputtering process or a patterning process may be performed to form a sensing electrode including indium tin oxide, indium zinc oxide and/or another suitable material, and then a coating process may be performed to form a protection layer covering the sensing electrode, so as to protect the sensing electrode. The protection layer may be formed of, for example, glass, plastic, acrylic-based resin, siloxane-based resin, polyimide, combinations thereof and/or another suitable material. If the device layer 206 is a display structure, then the device layer 206 can also be bonded to the overcoat layer 204.

Figure 2C:
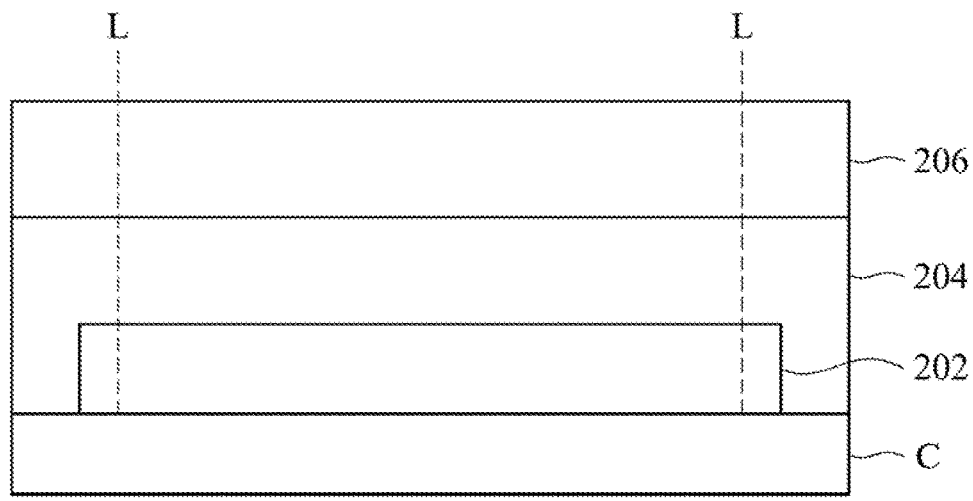
Figure 2D:
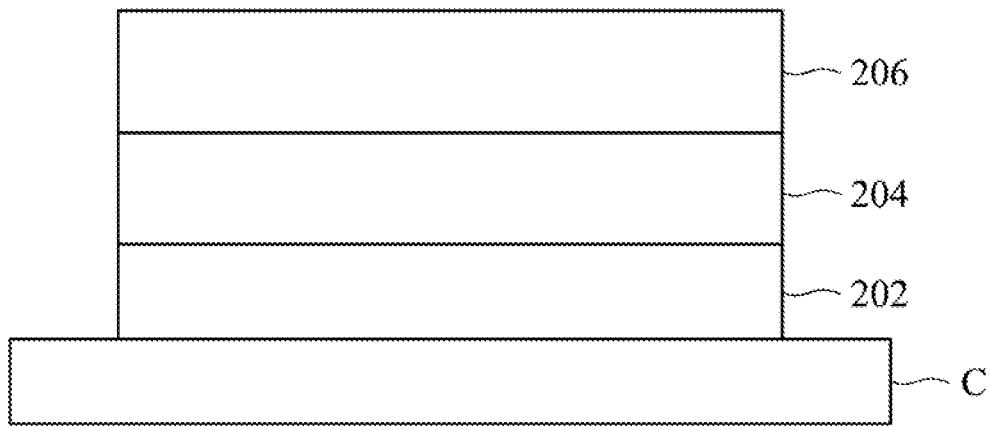

Afterwards, as shown in FIG. 2C, a cutting process is performed on the stacked structure of the flexible substrate 202, the overcoat layer 204 and the device layer 206 along a cutting line L. For example, the cutting process may be performed by using a scribing wheel, laser or another suitable method to remove unwanted portions of the flexible substrate 202, the overcoat layer 204 and the device layer 206, and the schematic cross-sectional view after the cutting process is as shown in FIG. 2D. In another embodiment, the device layer 206 may be formed within the area surrounded by the cutting line L, such that, the cutting process is performed only on the stacked structure of the flexible substrate 202 and the overcoat layer 204 but not on the device layer 206.

Figure 2E:
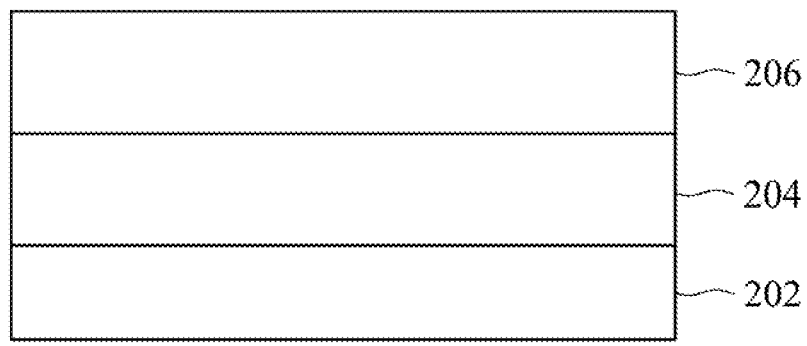

Then, as shown in FIG. 2E, the stacked structure of the flexible substrate 202, the overcoat layer 204 and the device layer 206 is separated from the carrier C to form the flexible panel 200. The water contact angles of the flexible substrate 202 and the carrier C may be greater than 40 degrees, so as to separate the flexible substrate 202 from the carrier C smoothly.

It can be seen from the above description that, according to the embodiments of the invention, the flexible substrate can be directly formed on the carrier, such that an additional layer that helps release between the carrier and the flexible substrate may not be needed, and the flexible substrate can be separated from the carrier by the overcoat layer thereon, thereby reducing the production costs and ensure the quality of the flexible panel.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A flexible touch panel, comprising:
   a flexible touch substrate;
   an overcoat layer disposed over and directly contacting the flexible touch substrate, wherein an adhesive force of the overcoat layer obtained according to an ASTM D3359 cross-cut test is greater than 4B;
   a device layer disposed over the overcoat layer; and
   a waterproof layer interposed between the overcoat layer and the device layer.

2. The flexible touch panel of claim 1, wherein the overcoat layer includes an organic material layer.

3. The flexible touch panel of claim 2, wherein the overcoat layer includes acrylic, diethylene glycol methylethyl ether, methyl 3-methoxypropionate, poly-functional monomers or additives.

4. The flexible touch panel of claim 1, wherein the waterproof layer includes aluminum oxide, aluminum nitride, silicon oxide, or silicon nitride.

5. The flexible touch panel of claim 1, wherein the device layer comprises a touch electrode layer.

6. The flexible touch panel of claim 1, wherein a thickness of the flexible touch substrate is in a range from 8 microns to 10 microns.

7. A flexible touch panel, comprising:
   a flexible touch substrate;
   an overcoat layer disposed over and directly contacting the flexible touch substrate, wherein an adhesive force of the overcoat layer obtained according to an ASTM D3359 cross-cut test is greater than 4B;
   a device layer disposed over the overcoat layer; and an optical layer interposed between the overcoat layer and the device layer.

8. The flexible touch panel of claim 7, wherein the overcoat layer includes an organic material layer.

9. The flexible touch panel of claim 8, wherein the overcoat layer includes acrylic, diethylene glycol methylethyl ether, methyl 3-methoxypropionate, poly-functional monomers or additives.

10. The flexible touch panel of claim 7, wherein the optical layer includes niobium oxide, silicon oxide, titanium oxide, silicon nitride, or magnesium fluoride.

11. The flexible touch panel of claim 7, wherein the device layer comprises a touch electrode layer.

12. The flexible touch panel of claim 7, wherein a thickness of the flexible touch substrate is in a range from 8 microns to 10 microns.

13. A flexible touch panel, comprising:
a flexible touch substrate;
an overcoat layer disposed over and directly contacting the flexible touch substrate, wherein an adhesive force of the overcoat layer obtained according to an ASTM D3359 cross-cut test is greater than 4B;
a device layer disposed over the overcoat layer;
a waterproof layer disposed over and directly contacting the overcoat layer; and
an optical layer interposed between the waterproof layer and the device layer.

14. The flexible touch panel of claim 13, wherein the overcoat layer includes an organic material layer.

15. The flexible touch panel of claim 14, wherein the overcoat layer includes acrylic, diethylene glycol methylethyl ether, methyl 3-methoxypropionate, poly-functional monomers or additives.

16. The flexible touch panel of claim 13, wherein the overcoat layer includes organic material layers and inorganic material layers that are alternately stacked.

17. The flexible touch panel of claim 13, wherein the optical layer includes niobium oxide, silicon oxide, titanium oxide, silicon nitride, or magnesium fluoride.

18. The flexible touch panel of claim 13, wherein the waterproof layer includes aluminum oxide, aluminum nitride, silicon oxide, or silicon nitride.

19. The flexible touch panel of claim 13, wherein the device layer comprises a touch electrode layer.

20. The flexible touch panel of claim 13, wherein a thickness of the flexible touch substrate is in a range from 8 microns to 10 microns.

* * * * *